United States Patent [19]

Tsuchida et al.

[11] 3,981,583
[45] Sept. 21, 1976

[54] APPARATUS FOR AUTOMATICALLY PROCESSING PHOTOPOLYMER PLATES

[75] Inventors: Shozo Tsuchida, Kawashishi; Sakuo Okai, Joyoshi, both of Japan

[73] Assignee: Nippon Paint Co., Ltd., Osaka, Japan

[22] Filed: Aug. 23, 1973

[21] Appl. No.: 390,874

[52] U.S. Cl. ............................. 355/100; 354/325; 355/85
[51] Int. Cl.² ........................................ G03B 27/30
[58] Field of Search .................. 355/85, 89, 97, 99, 355/100, 106, 125; 354/297, 317, 318, 325

[56] References Cited
UNITED STATES PATENTS

| | | | |
|---|---|---|---|
| 2,404,138 | 7/1946 | Mayer | 354/317 |
| 2,555,874 | 6/1951 | Coughlin | 354/317 X |
| 2,677,320 | 5/1954 | Coughlin | 354/317 X |
| 3,085,488 | 4/1963 | Heiart | 355/100 |
| 3,230,857 | 1/1966 | Ritzerfeld et al. | 355/89 X |
| 3,271,226 | 9/1966 | Staehle et al. | 354/297 X |
| 3,608,464 | 9/1971 | Harrell et al. | 354/317 |
| 3,751,164 | 8/1973 | Miller et al. | 355/100 |
| 3,848,998 | 11/1974 | Yonekura et al. | 355/100 |

*Primary Examiner*—Fred L. Braun
*Attorney, Agent, or Firm*—Hume, Clement, Brinks, Willian, Olds & Cook, Ltd.

[57] ABSTRACT

An apparatus for processing photopolymer plates includes an exposure unit, a washing unit, and a drying unit. The plate, which has a water-developable photopolymer surface, is continuously conveyed through each unit so that the functions therein performed, are done automatically. More particularly, exposure is accomplished by bringing a negative photographic image into alignment with the water-developable photopolymer plate, and then passing light through the negative and onto portions of the plate. Unexposed areas of the plate are then washed away in the washing unit, thus producing a relief surface necessary for letter-press printing. Finally, the photopolymer plate is conveyed to the drying unit where drying and postcuring take place.

7 Claims, 6 Drawing Figures

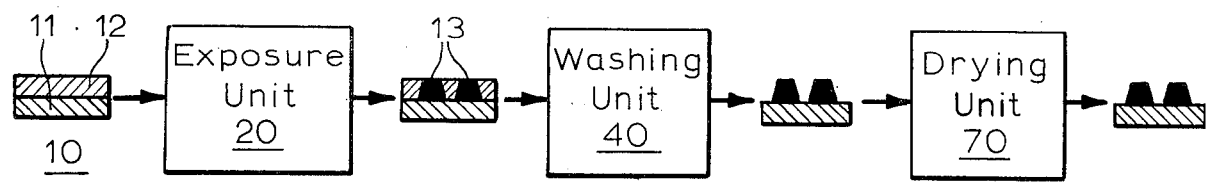
FIG. 1
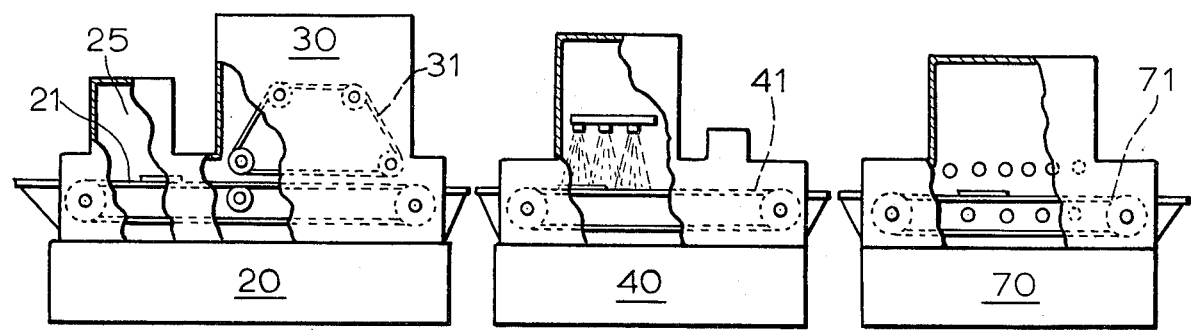
FIG. 2
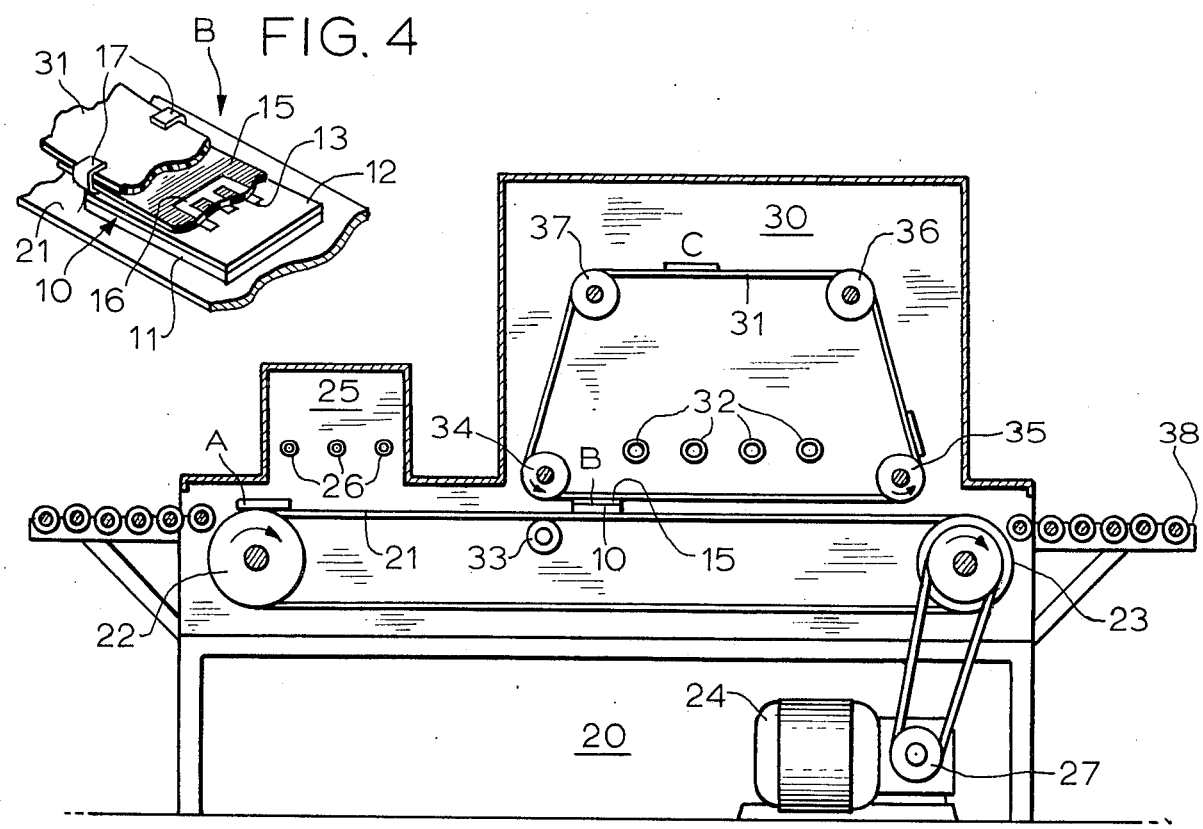
FIG. 4
FIG. 3

3,981,583

APPARATUS FOR AUTOMATICALLY PROCESSING PHOTOPOLYMER PLATES

BACKGROUND OF THE INVENTION

The present invention relates to an apparatus for photographically producing a relief surface on photopolymer plates so that the latter can be used in conventional letter-press printing operations. The photopolymer plates used in conjunction with the apparatus of the invention are developable with water, and are more fully described in the co-pending application of Sakuo Okai, Ser. No. 373,174, filed June 25, 1973, now U.S. Pat. No. 3,877,939, entitled "PHOTOPOLYMER PRINTING PLATES AND COATED RELIEF PRINTING PLATES".

A common process in the letter-press printing industry is the production of relief printing plates using photopolymer plates. A photopolymer plate is a laminated structure consisting of a thin coating of photo-sensitized plastic (a photopolymer surface) bonded to a metal or plastic base. The plate is exposed to the action of light through a negative photographic image (sometimes referred to hereinafter as a negative) causing the photosensitized coating to harden in those areas exposed to the light. The unexposed areas are then washed away by means of a suitable solution leaving a relief image. The plate is subsequently dried and postcured, whereupon it is ready for use in printing press operations. The use of such photopolymer plates is advantageous because of their inherent qualities which overcome many of the environmental problems associated with heavier, metal printing plates. However, the present production of each photopolymer plate requires several separate and sometimes isolated stages which are both expensive and time consuming. Moreover, the process generally requires considerable manpower. There is a need, therefore, to cut the expense, time, and manpower required for producing photopolymer printing plates. This need is especially apparent in newspaper plants, or large-scale printing concerns, which have to produce a substantial number of printing plates in a limited time.

It is accordingly an object of the present invention to provide an improved automatic apparatus for processing photopolymer plates requiring only the input of a photopolymer plate and a negative for the production of letter-press printing plates.

It is another object of this invention to provide an improved apparatus fo  ntinuously processing photopolymer printing plate It is a further object o. his invention to provide an improved method for processing photopolymer printing plates.

Other objects, features, and advantages of this invention will be apparent upon referring to the accompanying drawings in which:

FIG. 1 is a block diagram representing the basic units of operation of the apparatus of the invention including a sectional view of a photopolymer plate before and after it passes through each unit.

FIG. 2 is partially sectional and schematic side view of the apparatus of the invention including the exposure unit, washout unit, and drying unit; shown in FIG. 1.

FIG. 3 is a partially sectional and enlarged side view of the exposure unit shown in FIG. 2.

FIG. 4 is an enlarged perspective view, partially cutaway, of a portion of the exposure unit shown in FIG. 3.

Figure 5:
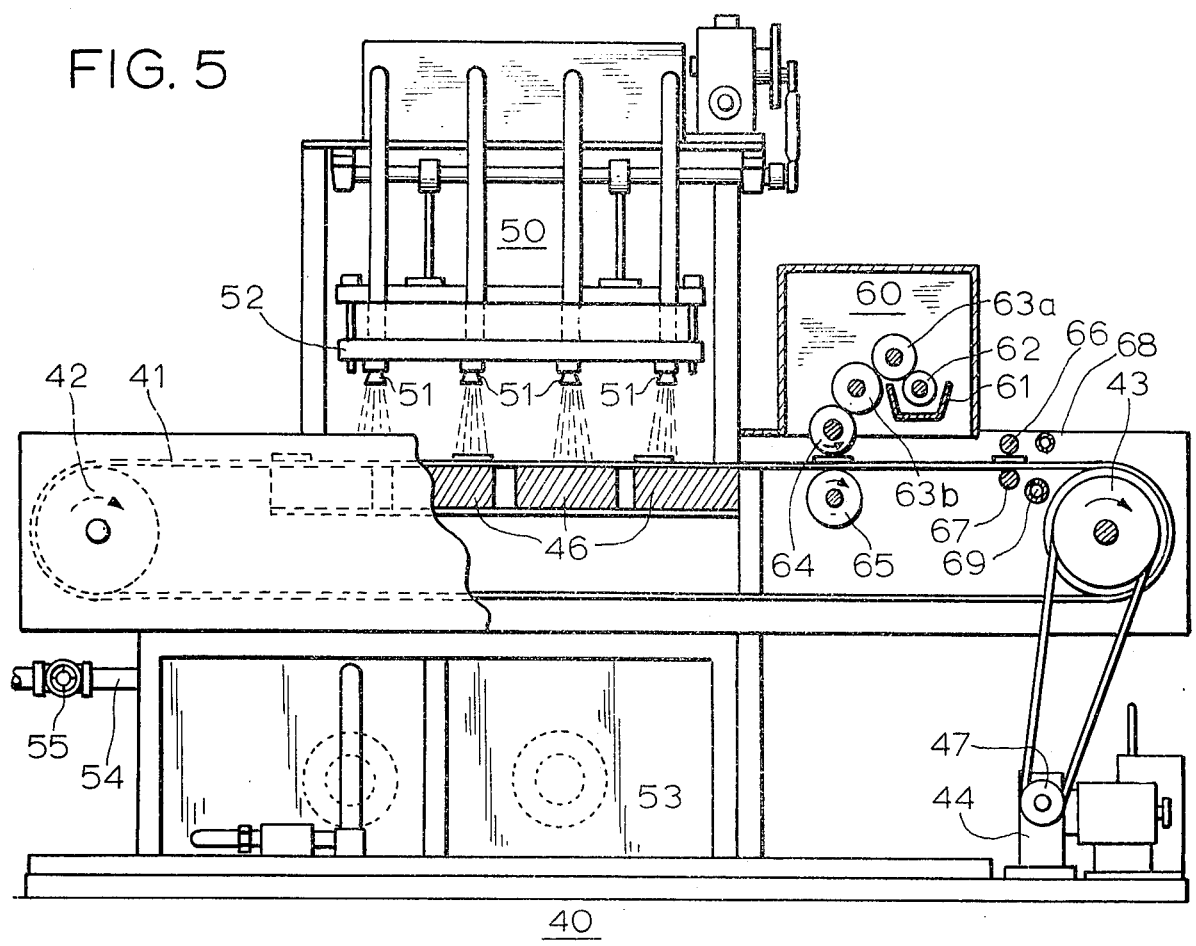
FIG. 5 is a partially sectional and enlarged side view of the washout unit shown in FIG. 2.

Referring now to FIG. 1, an exposure unit 20, a washing unit 40, and a drying unit 70 are portrayed in block form to represent the three basic units of operation of the apparatus of the invention. FIG. 1 further shows a photopolymer printing plate 10 having a base 11, comprised of aluminum or similar material, and a water-developable photopolymer surface 12. Upon passing through exposure unit 20, portions of photopolymer plate 10 are exposed through a negative (not shown) and sent to washing unit 40. The exposed portions of photopolymer plate 10 appear as darkened areas 13 on photopolymer surface 12. In washing unit 40, as further explained below, the unexposed portions of photopolymer surface 12 are removed, leaving only exposed portions 13 and droplets of washout liquid (not shown) left on photopolymer surface 12. Photopolymer plate 10 is then passed to drying unit 70, where final drying and postcuring of photopolymer surface 12 takes place. After leaving drying unit 70, photopolymer plate 10 is ready for use in conventional letter-press printing operations.

Exposure unit 20, washing unit 40, and drying unit 70 are better seen in FIG. 2. More particularly, exposure unit 20 includes a pre-exposure chamber 25 and an exposure chamber 30. It should be emphasized, however, that chamber 25 and chamber 30 need not actually define a bounded space, but only refer to areas in which the pre-exposure and exposure functions take place. As more fully explained below, exposure chamber 30 includes a transparent conveyer belt 31, adapted to carry a negative photographic image 15 (shown in FIGS. 3 and 4). Running horizontally through the entire length of exposure unit 20 is another conveyor belt 21.

Washer unit 40 also has a conveyer 41 running horizontally through the entire length thereof. Conveyer 41 is preferably comprised of a wire mesh, and is therefore referred to as a net conveyor. Exposure unit 20 and washing unit 40 are aligned in such a manner that photopolymer plates carried by conveyer 21 can be automatically and continuously passed to a net conveyor 41. Similarly, drying unit 70 includes a horizontal conveyer 71 aligned with net conveyor 41 in such a manner as to permit the continuous passage of photopolymer plates carried by net conveyor 41 to conveyer 71.

As shown in FIG. 3, conveyer 21 is an endless belt supported by a pair of rollers 22 and 23 and a pressure roller 33. Similarly, conveyer 31 is supported by rollers 34, 35, 36, and 37. A motor 24 is used to drive conveyer 21 in a clockwise direction, by a pulley 27 coupled to roller 23. Motor 24 drives transparent conveyer 31 in a counter-clockwise direction, through suitable mechanical linkages (not shown). The bottom of conveyer 31 thus moves at the same speed and in the same direction (indicated by arrows) as the top of conveyer 21.

As discussed in the description of FIG. 2, above, exposure unit 20 includes a pre-exposure chamber 25. Chamber 25 has a plurality of ultraviolet lamps 26, which serve as a source of actinic light for preparing the photopolymer plates for exposure. Pre-exposure by lamps 26 reduces the level of undesired oxygen in the photopolymer surface of the photopolymer plates, and eliminates the need to precondition the plates by such conventional techniques as exposing them to carbon-dioxide for extended periods of time.

It is desirable to expose the photopolymer plates to light from ultraviolet lamps 26 for approximately seven to eight seconds. This period of pre-exposure is preferably accomplished by adjusting the speed of conveyer 21 and the dimensions of chamber 25 so that a photopolymer plate need merely ride along conveyer 21 through pre-exposure unit 25 with lamps 26 constantly on. It is apparent, however, that a proper pre-exposure period can also be accomplished through the use of contact switches, timing devices, and the like.

After passing through pre-exposure chamber 25, the photopolymer plates enter exposure chamber 30 where a negative photographic image 15 is brought into alignment with the plate. This is accomplished by placing negative 15 on conveyer 31, which is held thereon by electrostatic forces between negative 15 and conveyer 31. Negative 15 could be further secured to conveyer 31 with pressure sensitive tape or similar means. Since transparent conveyer 31 and conveyer 21 move in synchronism as a result of their both being driven by motor 24, it is a simple matter to time the arrival of negative to reach a point B, between conveyers 21 and 31, simultaneously with the arrival of photopolymer plate 10. Thus, for example, if a photopolymer plate is placed on conveyer 21 at point A and a negative 15 is placed on conveyer 31 at point C, both should pass between rollers 33 and 34, and arrive simultaneously at point B. It should be noted, however, that before arriving at point B, photopolymer plate 10 and negative 15 are brought into close contact with each other as a result of pressures exerted between rollers 33 and 34.

FIG. 4, which shows a close-up of photopolymer plate 10 and negative 15 at point B, indicates that negative 15 has been turned upside down relative to its position at point C. Negative 15, having a plurality of images 16, can therefore be brought into contact with plate 10 so that images 16 can be imparted to photopolymer surface 12 upon exposure. The areas on photopolymer surface 12, underlying images 16, will become darkened and hardened after exposure to permit subsequent production of a relief surface on photopolymer plate 10. These areas are represented by numeral 13 though, as explained above, they do not appear until plate 10 passes through exposure chamber 30.

As shown in FIG. 3, exposure chamber 30 includes a light source comprising a plurality of discharge lamps 32 directed at photopolymer plate 10 as it moves along conveyer 31. Discharge lamps 32 emit light suitable for the photopolymerization of surface 12, and therefore high pressure mercury lamps, metal halide lamps or xenon lamps are preferred. Moreover, lamps 32 are preferably of the tubular type, rather than bulb type.

Thus, when negative 15 is brought into contact with photopolymer surface 12 of plate 10, light from lamps 32 pass through transparent conveyer 31, negative 15, and strikes photopolymer surface 12 to expose portions thereof. As explained in detail in the above mentioned co-pending application of Sakuo Okai, the exposed portions of photopolymer surface 12 become hardened onto plate 10, and are thus less readily removed than the unexposed portions.

After exposure, negative 15 continues to move along conveyer 31 passing around roller 35 where it can be readily removed if desired. Photopolymer plate 10, on the other hand, continues to move along conveyer 21 to a roller table 38, where it is readily transferred to washing unit 40.

Washing unit 40 is best understood by reference to FIG. 5, showing net conveyer 41 supported by rollers 42 and 43. A motor 44 is used to drive net conveyer 41 by means of a pulley 47 coupled to roller 43. Washing unit 40 includes a washout chamber 50 having means in the form of a plurality of nozzles 51 for directing a high-pressure stream of washout liquid at photopolymer plates 10 moving along conveyer 41. Nozzles 51 are secured to a reciprocating bar 52 adapted to move alternately back and forth above and perpendicular to the direction of movement of plate 10 along conveyer 41. In this way, washout liquid emanating from nozzles 51 can spray washout liquid across all of surface 12 of photopolymer plates 10. The washout liquid from nozzles 51 thus remove the unexposed portions of photopolymer surface 12, leaving only the hardened or exposed portions thereof. This creates a relief surface on photopolymer plate 10, readily usuable for letter-press printing.

If necessary, a plurality of magnets 46 can be secured under net conveyer 41 in order to hold photopolymer plates 10 in position as they pass through washing unit 40. It should be noted, however, that this can also be accomplished by the use of clamps, tape, or other means.

Located underneath nozzles 51 and conveyer 41 is a washout tank 53 having an inlet pipe 54 and an inlet valve 55. Washout liquid from nozzles 51 passes through net conveyer 41 and collects in tank 53. A circulating pump (not shown) is coupled between tank 53 and nozzles 51 for the purpose of recirculating the washout liquid. In the event the composition of washout fluid must be changed, chemicals can be passed through valve 55 and inlet pipe 54 into tank 53. These chemicals, upon combining with the washout fluid in tank 53 are then recirculated through the circulation pump to nozzles 51. Tank 53 can also be provided with an overflow pipe (not shown) to prevent loss or spillage of the washout liquid.

If it is required to subject photopolymer plates 10 to further treatment, such as to increase the hardness of the exposed portions of photopolymer surface 12 or to improve the water resistant properties thereof, this can be accomplished in a postwashing chamber 60. Chamber 60 includes a treatment tank 61 containing a suitable treatment liquid, a treatment roller 62, a pair of transfer rollers 63a and 63b, and an application roller 64. Rollers 62–64 are successively engageable so that treatment liquid from tank 61 is absorbed by roller 62, transferred through rollers 63a and 63b to application roller 64, and applied to photopolymer plate 10 when it passes under roller 64 along conveyer 41. A pressure roller 65 aligned with application roller 64 under conveyer 41, supplies sufficient pressure between photopolymer surface 12 and roller 64 to permit the application of treatment liquid therefrom.

If desired, washing unit 40 may also include a pair of wringer rollers 66 and 67, secured immediately above and below conveyer 41 at a point beyond washout chamber 50. When plate 10 passes along conveyer 41 through wringer rollers 66 and 67, excess liquid from washing chamber 50 and postwashing chamber 60 can be squeezed off. In addition, an air-squeeze tube 68 secured immediately above conveyer 41 and beyond wringer rollers 66 and 67 can be adapted to emit a blast of dry compressed air onto photopolymer plate 10 as it travels along conveyer 41. If further drying is desired, a second air-squeeze tube 69 can be secured under conveyer 41, preferably in alignment with air-squeeze tube 68. Employment of air-squeeze tubes 68 and 69 would thus effectuate partial drying of photopolymer surface 12 and base 11 of photopolymer plate 10 prior to its passage to drying unit 70.

Figure 6:
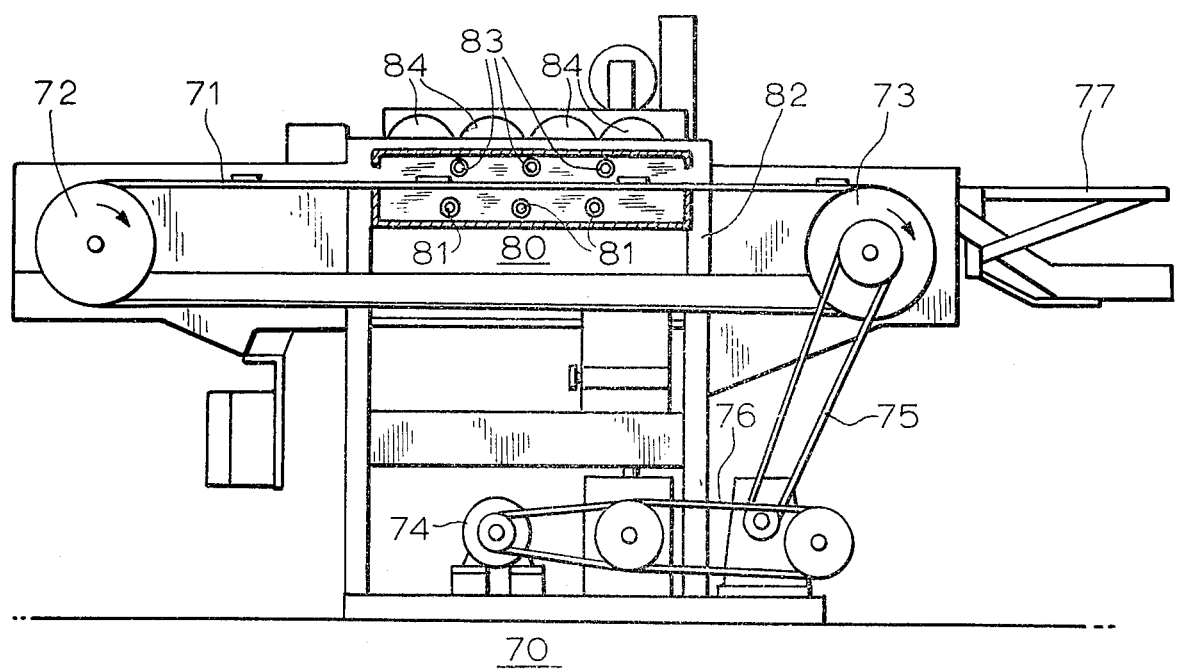
FIG. 6 is a partially sectional and enlarged side view of the drying unit shown in FIG. 2.

As shown in FIG. 6, drying unit 70 includes a conveyer 71 supportable by rollers 72 and 73. A motor 74, coupled to roller 73 by pulleys 75 and 76 is used to drive conveyer 71. Like conveyer 41, conveyer 71 is preferably fabricated from a wire mesh, and is therefore referred to as a net conveyer. Drying unit 70 includes a drying and postcuring chamber 80 having a hot air supplier 81 secured directly under conveyer 71 and a blower 82 preferably located under hot air supplier 81 so that hot air can be directed up toward the photopolymer plates moving along conveyer 71. Drying unit 70 further includes infrared heating tubes 83 secured immediately above conveyer 71, and tubular high pressure mercury lamps 84, also located above conveyer 71. Drying and postcuring chamber 80 further includes an exhaust damper (not shown) to permit the exhaust of hot air.

Heating tubes 83 penetrate the photopolymer layer 12 thereby drying the inside of plate 10 as well as the surface. Heating tubes 83 thus shorten the drying time of the entire operation. Mercury lamps 34, on the other hand, cause a further hardening of photopolymer surface 12 in the event it had not been adequately hardened in exposure unit 20. Hot air supplier 81 used in conjunction with blower 82, effects a total circulation of hot air so that base 11 as well as photopolymer surface 12 are evenly dried.

Finally, drying unit 70 includes a receiving table 77 on which photopolymer plates 10 are deposited. It is thus clear, that photopolymer plates can be continually processed with the above described apparatus so that a printing plate having a relief image can be quickly and inexpensively manufactured. Moreover, the entire process can be done automatically, without manually transferring the photopolymer plates from one stage to another. The invention thus makes possible a considerable reduction in manpower, time, and expense in the production of plates for letter-press printing.

We claim:

1. An apparatus for processing plates having a photopolymer surface comprising: an exposure unit having a first conveyer for carrying said plates, a transparent photographic image conveyer alignable with said first conveyer and movable in the same direction as said first conveyer, and a light source adapted to pass light through said transparent photographic image conveyer for exposing portions of said photopolymer surface; a washing unit having a net conveyer adapted to continuously receive said plates from said first conveyer, and nozzle means directed at said net conveyer, for spraying washout liquid on said plates to wash away the unexposed portions of said photopolymer surface, said nozzle means disposed above and at right angles to the plane of said net conveyer and operable in reciprocating motion perpendicular to the direction of movement of said plates; and a drying unit having a second conveyer adapted to continuously receive said plates from said net conveyer, and means for drying said plates carried by said second conveyer, said drying means including hot air blowers, infrared heating tubes and mercury lamps directed at said plates whereby plates are continuously processed for letter-press printing.

2. The apparatus recited in claim 1 wherein said exposure unit further includes a source of actinic light in advance of said light source directed toward said first conveyer for pre-exposing said photopolymer surface.

3. The apparatus recited in claim 1 wherein said washing means includes means, disposed beyond said nozzle means, for treating said photopolymer surface thereby, improving the printing properties of said plates.

4. An apparatus for processing plates for letter-press printing having a photopolymer surface comprising:
means for continuously and automatically conveying said plates during processing;
exposure means, for exposing portions of said photopolymer surface, including at least one light source, and a photographic image conveyer means alignable with said plates when said plates are conveyed through said exposure means, said photographic image conveyer means comprising a transparent conveyer adapted to carry a photographic image between said light source and said photopolymer surface, in the same direction as said plates, whereby light from said light source may be passed through said photographic image to expose portions of said photopolymer surface;
washing means for removing unexposed portions of said photopolymer surface to produce a relief surface on said plates said washing means including a net conveyer forming a portion of said conveyer means and nozzle means directed at said net conveyer for spraying washout liquid at said plates, said nozzle means disposed above and at right angles to said net conveyer and movable in reciprocating motion perpendicular to the direction of movement of said plates; and
means for drying and postcuring said plates, said drying means including hot air blowers, infrared heating tubes and mercury lamps directed at said plates when said plates are conveyed by said means for continuously conveying said plates; whereby said plates are continuously processable and immediately usable for letter-press printing.

5. The apparatus recited in claim 4 wherein said exposure means includes a pre-exposure area having a source of actinic light for pre-exposing said photopolymer surface.

6. The apparatus recited in claim 4 wherein said washing means includes means for treating said photopolymer surface after removing said unexposed portions from said plates, thereby improving the printing properties of said plates.

7. The apparatus recited in claim 4 wherein said washing means includes means for removing excess liquid from said plates.

* * * * *